(12) United States Patent
Chen

(10) Patent No.: US 6,788,143 B1
(45) Date of Patent: Sep. 7, 2004

(54) CASCODE STAGE FOR AN OPERATIONAL AMPLIFIER

(75) Inventor: Sean S. Chen, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/136,196

(22) Filed: Apr. 29, 2002

(51) Int. Cl.[7] .............................................. H03F 3/45
(52) U.S. Cl. ...................................... 330/253; 330/311
(58) Field of Search ................................. 330/253, 292, 330/311

(56) References Cited

U.S. PATENT DOCUMENTS

| | | | | |
|---|---|---|---|---|
| 4,933,643 A | * | 6/1990 | Jandu et al. ................. 330/253 |
| 5,349,304 A | * | 9/1994 | Ryat .............................. 330/253 |
| 5,446,412 A | * | 8/1995 | Kimyacioglu et al. ....... 330/253 |
| 5,731,739 A | * | 3/1998 | Ho ................................ 330/253 |
| 5,777,517 A | * | 7/1998 | Seshita ......................... 330/277 |
| 5,900,783 A | * | 5/1999 | Dasgupta ..................... 330/264 |
| 6,150,883 A | * | 11/2000 | Ivanov ......................... 330/253 |
| 6,160,450 A | * | 12/2000 | Eschauzier et al. ......... 330/253 |
| 6,194,966 B1 | * | 2/2001 | Dasgupta ..................... 330/253 |

* cited by examiner

Primary Examiner—Khanh Van Nguyen
(74) Attorney, Agent, or Firm—Brett A. Hertzberg; Merchant & Gould P.C.

(57) ABSTRACT

A cascode stage is arranged to improve performance of an operational amplifier. The cascode stage includes transistors that are arranged to operate as a current mirror. Each side of the current mirror has a corresponding voltage at a corresponding node. One of the corresponding nodes corresponds to a high impedance node that is coupled to a subsequent stage of the amplifier. The voltages at the corresponding nodes are closely matched to one another such that the input referred offset in the amplifier is minimized and the power supply rejection ratio is improved (PSRR). A transistor threshold voltage and a transistor saturation voltage determine the headroom requirements of the cascode stage, such that low power supply voltage operation is possible. The biasing of the transistors in the cascode stage is simplified such that minimal biasing circuitry is required, and overall power consumption may be minimized.

18 Claims, 4 Drawing Sheets

CASCODE STAGE FOR AN OPERATIONAL AMPLIFIER

FIELD OF THE INVENTION

The present invention is related to operational amplifiers that include cascode stages. More particular, the present invention is related to a cascode stage that is arranged to operate with reduced input referred offset voltages.

BACKGROUND OF THE INVENTION

A portion of a conventional operational amplifier (400) that includes an input stage and a cascode stage is illustrated in FIG. 4. The cascode stage includes metal oxide semiconductor (MOS) transistors M401–M406 and current sources I41–I42. The input stage includes MOS transistors M407–M408 and current source I43.

Transistor M401 has a gate that is coupled to a bias potential (VBLkS), a J source that is coupled to node 41, and a drain that is coupled to node 43. Transistor M402 has a gate that is coupled to the bias potential (VBIAS), a source that is coupled to node 42, and a drain that is coupled to node 44. Transistor M403 has a gate and drain that is coupled to node 43, and a source that is coupled to node 45. Transistor M404 has a gate that is coupled to node 43, a source that is coupled to node 46, and a drain that is coupled to node 44. Transistor M405 has a gate that is coupled to node 46, a source that is coupled to a high power supply (VHI), and a drain that is coupled to node 45. Transistor M406 has a gate and drain that are coupled to node 46, and a source that is coupled to the high power supply (VHI). Transistor M407 has a gate that is arranged to receive input signal INM4, a source that is coupled to node 47 and a drain that is coupled to node 42. Transistor M408 has a gate that is arranged to receive input signal INP4, a source that is coupled to node 47 and a drain that is coupled to node 41. Current sources I41–I43 are coupled to nodes 41, 42, respectively.

The input stage is arranged to drive currents into the cascode stage based on the difference in input signals INP4 and INM4. The cascode stage is arranged to receive the drive currents via nodes 41 and 42, respectively. The input stage and the cascode stage cooperate with one another to provide gain in response to the input signals based on their difference. The output of the cascode stage corresponds to node 44, which may be used to drive another stage of the amplifier.

SUMMARY OF THE INVENTION

In accordance with the present invention, a cascode stage is arranged to improve performance of an operational amplifier. The cascode stage includes transistors that are arranged to operate as a current mirror. Each side of the current mirror has a corresponding voltage at a corresponding node. One of the corresponding nodes corresponds to a high impedance node that is coupled to a subsequent stage of the amplifier. The voltages at the corresponding nodes are closely matched to one another such that the input referred offset in the amplifier is minimized and the power supply rejection ratio is improved (PSRR). A transistor threshold voltage and a transistor saturation voltage determine the headroom requirements of the cascode stage, such that low power supply voltage operation is possible. The biasing of the transistors in the cascode stage is simplified such that minimal biasing circuitry is required, and overall power consumption may be minimized.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

In accordance with the present invention, a cascode stage is arranged to improve performance of an operational amplifier. The cascode stage includes transistors that are arranged to operate as a current mirror. Each side of the current mirror has a corresponding voltage at a corresponding node. One of the corresponding nodes corresponds to a high impedance node that is coupled to a subsequent stage of the amplifier. The voltages at the corresponding nodes are closely matched to one another such that the input referred offset in the amplifier is minimized and the power supply rejection ratio is improved (PSRR). A transistor threshold voltage and a transistor saturation voltage determine the headroom requirements of the cascode stage, such that low power supply voltage operation is possible. The biasing of the transistors in the cascode stage is simplified such that minimal biasing circuitry is required, and overall power consumption may be minimized.

Figure 4:
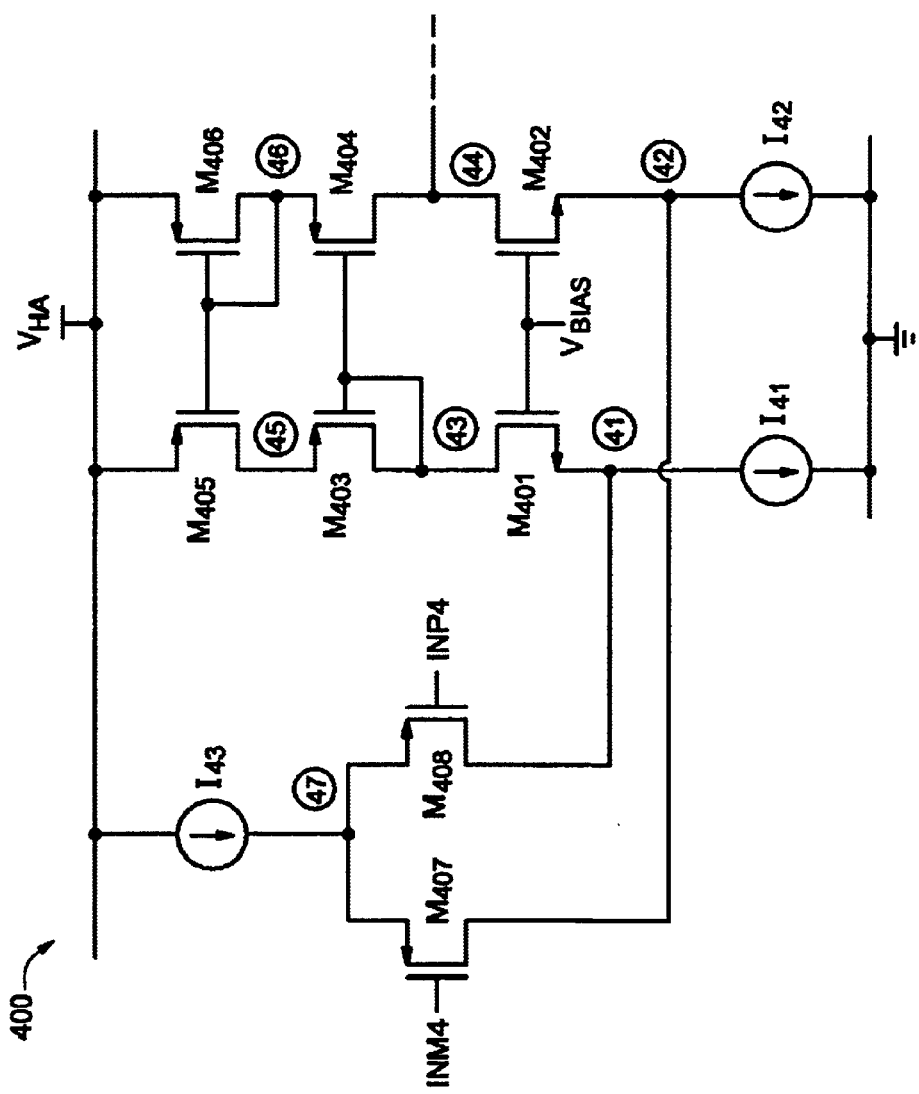
FIG. 4 is a schematic diagram of a conventional amplifier that includes a conventional cascode stage.

A cascode stage in an amplifier that is arranged in accordance with the present invention may be implemented as field effect transistors (FETs), bipolar junction transistors (BJTs), or any other appropriate transistor technology. A typical FET may have a threshold voltage of 1V and a saturation voltage of 200 mV, such that the minimum power supply requirements for a FET cascode stage is on the order of 1.4V. A typical BJT may have a threshold voltage of 0.6V and a saturation voltage of 200 mV, such that the minimum power supply requirements for a BJT cascode stage is on the order of 1.0V. In contrast, a conventional cascode stage such as that described in FIG. 4 has a minimum power supply requirement that is determined by two threshold voltages and a saturation voltage, resulting in a minimum power supply voltage of approximately 2.4V.

Amplifiers that are arranged in accordance with the present invention have been implemented using FET technology. The FET amplifiers have yielded less than 200 uV of input referred offset, and a PSRR (power supply rejection ratio) of 90 dB, over a power supply operating range from 1.5V to 8.0V. The maximum voltage associated with the power supply operating range is predominately due to the breakdown voltage of a particular process, which in this example is 8.0V. The minimum voltage associated with the power supply operating range is predominately determined by the threshold voltages and saturation voltages of the transistors in a particular process, which in this example corresponds to roughly 1.5V.

Figure 1:
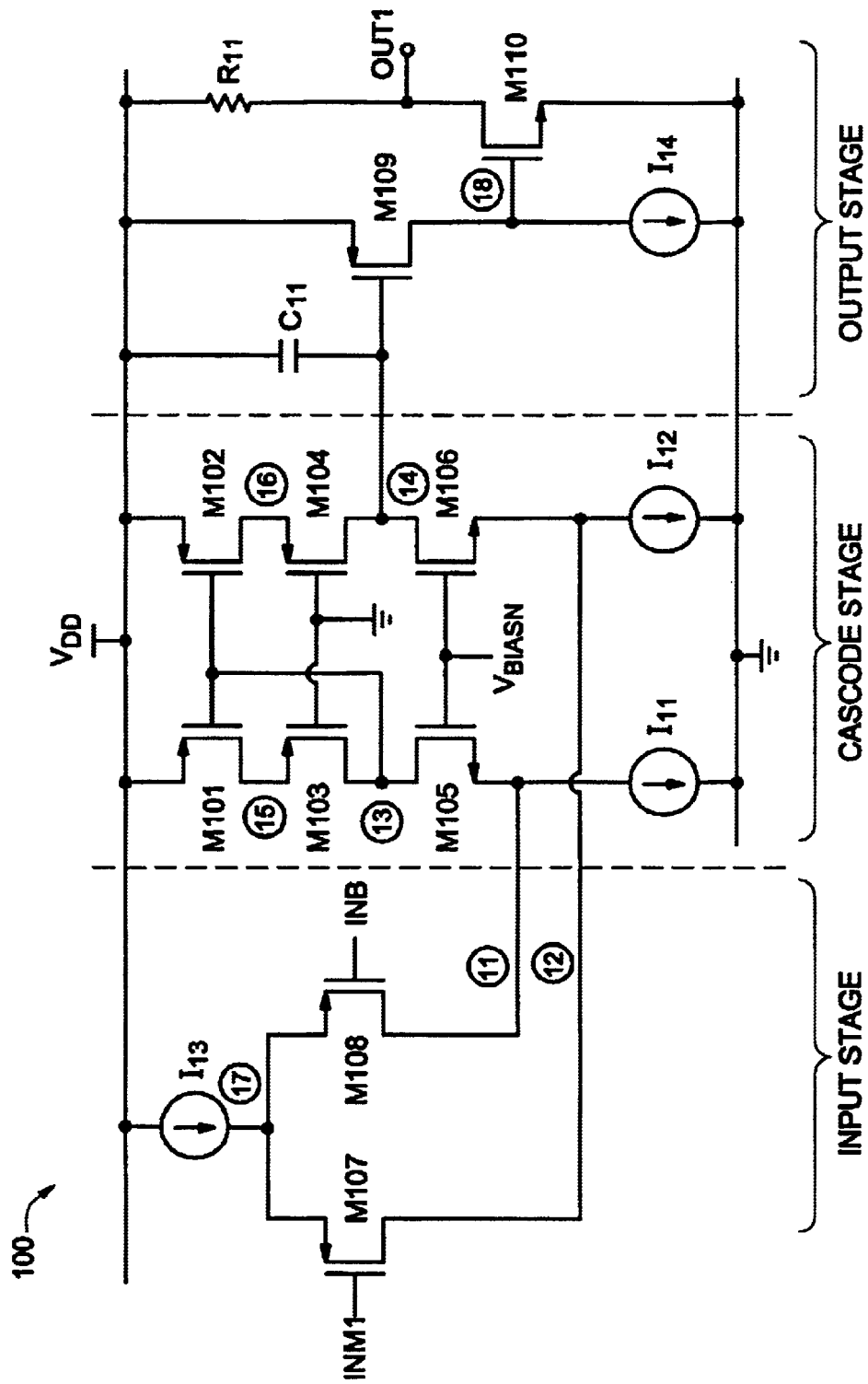
FIG. 1 is a schematic diagram of an operational amplifier that includes an exemplary cascode stage that is in accordance with the present invention.

FIG. 1 is a schematic diagram of an operational amplifier (100) that includes an exemplary cascode stage that is in accordance with the present invention. The operational amplifier (100) includes an input stage, a cascode stage, an output stage, and a compensation circuit.

The input stage includes transistors M107–108, and current source I13. Transistors M107 and M108 are illustrated as P-type field effect transistors. Transistor M107 includes a gate that is coupled to INM1, a source that is coupled to node 17, and a drain that is coupled to node 12. Transistor M108 includes a gate that is coupled to INP1, a source that is coupled to node 17, and a drain that is coupled to node 11. Current source I13 is coupled between the high power supply (VDD) and node 17.

The cascode stage includes transistors M101–M106, and current sources I11 and I12. Transistors M101–M104 are illustrated as P-type field effect transistors, while transistors M105–M106 are illustrated as N-type field effect transistors. Transistor M101 includes a source that is coupled to the high power supply (VDD), a gate that is coupled to node 13, and a drain that is coupled to node 15. Transistor M102 includes a source that is coupled to a high power supply (VDD), a gate that is coupled to node 13, and a drain that is coupled to node 16. Transistor M103 includes a source that is coupled to node 15, a gate that is coupled to a low power supply (GND), and a drain that is coupled to node 13. Transistor M104 includes a source that is coupled to node 16, a gate that is coupled to the low power supply (GND), and a drain that is coupled to node 14. Transistor M105 includes a source that is coupled to node 11, a gate that is coupled to a bias signal (i.e., bias voltage VBIAS), and a drain that is coupled to node 13. Transistor M106 includes a source that is coupled to node 12, a gate that is coupled to the biasing signal (i.e., bias voltage VBIAS), and a drain that is coupled to node 14. Current source I11 is coupled between node 11 and the low power supply (GND), while current source I12 is coupled between node 12 and the low power supply (GND).

The output stage includes transistors M109–M110, resistor R11, and current source I14. Transistor M109 is illustrated as a P-type field effect transistor, while transistor M110 is illustrated as an N-type field effect transistor. Transistor M109 includes a source that is coupled to the high power supply (VDD), a gate that is coupled to node 14, and a drain that is coupled to node 18. Transistor M110 includes a source that is coupled to the low power supply (GND), a gate that is coupled to node 18, and a drain that is coupled to an output node (OUT1). Resistor R11 is coupled between the high power supply (VDD) and the output node (OUT1). Current source I14 is coupled between node 18 and the low power supply (GND). The compensation circuit includes capacitor C11, which is coupled between the high power supply (VDD) and node 14. Capacitor C11 may alternatively be coupled between the low power supply (GND) and node 14.

Transistors M107–M108 and current source I13 are arranged to operate as a differential pair that steers currents to nodes 11 and 12 based upon the difference between inputs INP1 and INM1. The input stage cooperates with the cascode stage to provide a first gain factor to the input signal. Node 14 is a high impedance node that corresponds to the output of the cascode stage. The voltage at node 14 is related to the difference between the non-inverting and inverting inputs (INP1, INM1) and the first gain factor. Transistor M109 and current source I14 are arranged to operate as an inverting gain stage that receives the signal from node 14 and provides a second output signal at node 18. The output signal at node 18 is related to the signal at node 14 by a second gain factor. Transistor M110 and resistor R11 are arranged to operate as another inverting gain stage that receives the signal from node 18 and provides a third output signal to the output terminal (OUT1). The output (OUT1) of operational amplifier (100) is related to the signal at node 18 by a third gain factor. The overall gain of operation amplifier 100 is determined by the first, second, and third gain factors. The compensation circuit (e.g., C11) is arranged to provide stable operation of the operational amplifier by reducing the high frequency gain at node 14.

Transistor M108 injects a current corresponding to I13 into node 11 when INP1 is lower than INM1. The source voltage associated with transistor M105 will rise in response to the injected current such that transistor M105 will conduct less current than transistor M106. Since transistors M101–M104 are arranged as a current mirror, the drain voltage associated with transistor 106 will fall towards the low power supply. As the voltage at node 14 falls, transistor M109 is activated and the voltage associated with node 18 increases. Transistor M110 is activated by the increase in the voltage at node 18 such that OUT1 is decreased. Since the output (OUT1) decreases in response to a decrease in INP1, INP1 is referred to as the non-inverting input terminal.

When the difference between INP1 and INM1 are roughly zero, the currents in transistors M105 and M106 should be balanced such that the voltage associated with nodes 13 and 14 are nearly equal to one another. In other words, an offset voltage is applied between the INP1 and INM1 terminals to counteract any inherent difference between the potential at nodes 13 and 14.

Transistors M101/M102 and M103/M104 are arranged to operate as a cascode current mirror. Transistors M103 and M104 are biased by the low power supply such that they are in saturation (Vgs of M103/104 is very negative relative to their threshold voltage). Transistors M101 and M102 have gate potentials that are coupled to node 13 such that the potential associated with node 13 must be at least one P-type FET threshold voltage (Vtp) away from VDD for proper operation. Transistors M105 and M106 have an associated drain-source voltage that must operate up to their saturation voltage (Vdssat1). Thus, Vtp, and Vdssat1 determine the minimum power-supply requirements for operational amplifier 100. For example, VDD corresponds to 1.2V when transistors M101–M102 have a threshold voltage of −1V and transistors M105–M106 have a saturation voltage of 200 mV.

Current sources I11 and I12 may correspond to transistors that are biased to operate as current sources. For example, a matched pair of N-type field effect transistors that are biased by a common bias voltage may be employed as current sources I11 and I12. Similarly, a pair of N-type bipolar junction transistors (e.g., npn transistors) that are biased by a common bias signal may be employed as current sources I11 and I12. Alternatively, matched resistor circuits may replace current sources I11 and I12. Alternative circuits that provide the function of a current source may also be employed to replace current sources I13 and I14.

The minimum power supply requirements for the cascode stage also depend upon the type of current sources that are employed for current sources I11 and I12. For example, as described above current-sources I11 and I12 may correspond to a matched pair of N-type field effect transistors that have a saturation voltage of Vdssat2. The minimum power supply requirements for the cascode stage, including N-type FET current sources is determined by Vtp (e.g., −1V), Vdssat1 (e.g., 200 mV) and Vdssat2 (e.g., 200 mV) such that VDD must be at least 1.4V for proper operation.

A biasing circuit (not shown) is required to provide the biasing signals (e.g., VBIAS). The cascode stage illustrated in FIG. 1 requires a minimum number of biasing lines for proper operation. By reducing the number of required biasing lines, biasing circuitry is reduced in complexity and the total power consumption of the biasing circuit is reduced by eliminating the additional circuitry that would otherwise be required.

Figure 2:
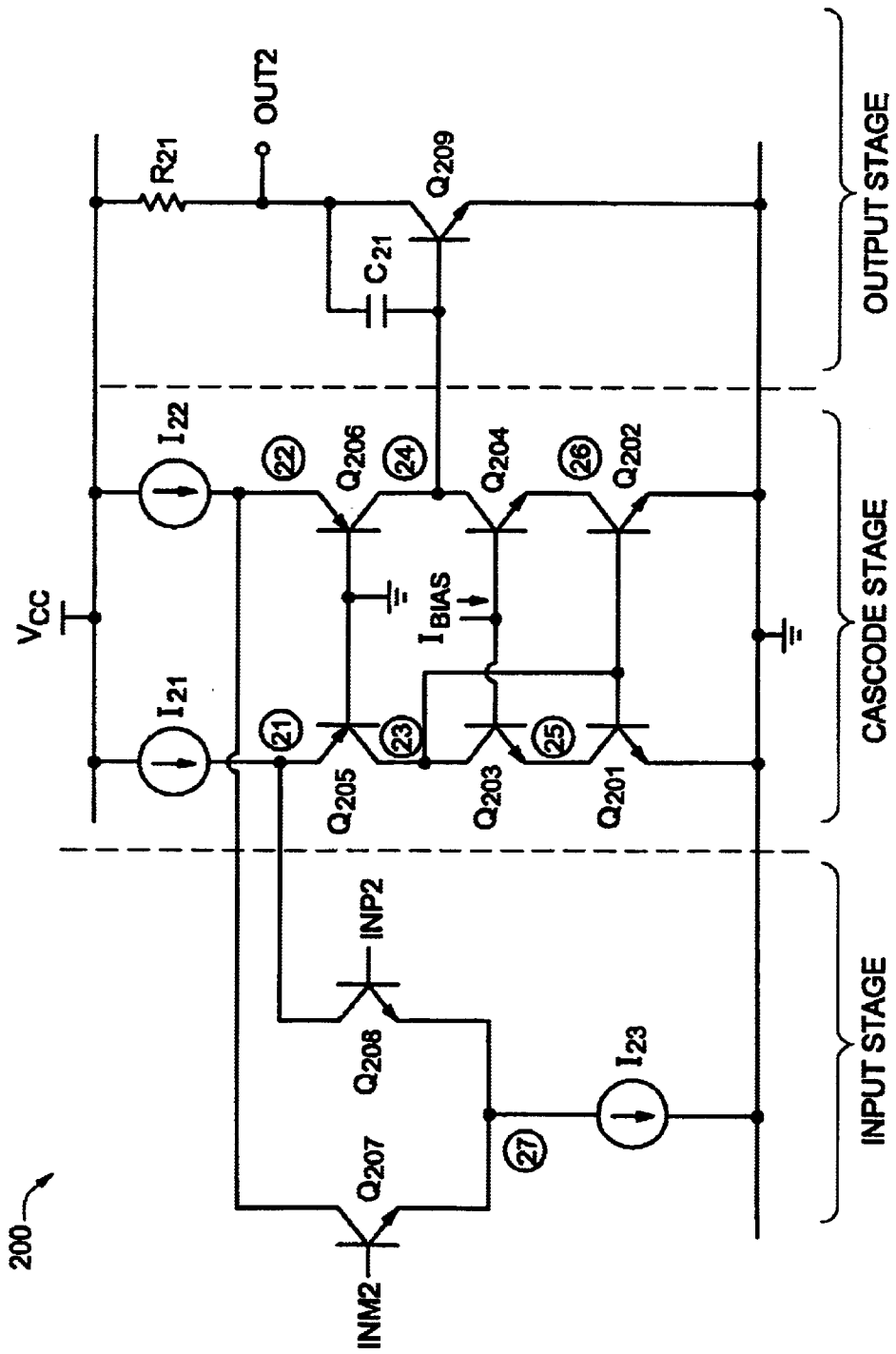
FIG. 2 is a schematic diagram of another operational amplifier that includes an exemplary cascode stage that is in accordance with the present invention.

FIG. 2 is a schematic diagram of another operational amplifier (200) that includes an exemplary cascode stage that is in accordance with the present invention. The operational amplifier (200) includes an input stage, a cascode stage, an output stage, and a compensation circuit.

The input stage includes transistors Q207–Q208, and current source I23. Transistors Q207–Q208 are illustrated as N-type bipolar junction transistors. Transistor Q207 includes an emitter that is coupled to node 27, a base that is coupled to INM2, and a collector that is coupled to node 22. Transistor Q208 includes an emitter that is coupled to node 27, a base that is coupled to INP2, and a collector that is coupled to node 21. Current source I23 is coupled between node 27 and a low power supply (GND). Transistors Q207–Q208 and current source I23 are arranged to operate as a differential pair that steers sinks currents from nodes 21 and 22 based upon the difference between inputs INP2 and INM2.

The cascode stage includes transistors Q201–Q206, and current sources I21 and I22. Transistors Q201–Q204 are illustrated as N-type bipolar junction transistors, while transistors Q205–Q206 are illustrated as P-type bipolar junction transistors. Transistor Q201 includes an emitter that is coupled to the low power supply (GND), a base that is coupled to node 23, and a collector that is coupled to node 25. Transistor Q202 includes an emitter that is coupled to the low power supply (GND), a base that is coupled to node 23, and a collector that is coupled to node 26. Transistor Q203 includes an emitter that is coupled to node 25, a base that is coupled to a bias signal (i.e., bias current IBIAS), and a collector that is coupled to node 23. Transistor Q204 includes an emitter that is coupled to node 26, a base that is coupled to the bias signal (i.e., bias current IBIAS), and a collector that is coupled to node 24. Transistor Q205 includes an emitter that is coupled to node 21, a base that is coupled to the low power supply (GND), and a collector that is coupled to node 23. Transistor Q206 includes an emitter that is coupled to node 22, a base that is coupled to the low power supply (GND), and a collector that is coupled to node 24. Current source I21 is coupled between the high power supply (VCC) and node 21, while current source I22 is coupled between the high power supply (VCC) and node 22.

The output stage includes transistor Q209, and resistor R21. Transistor Q209 is illustrated as an N-type bipolar junction transistor. Transistor Q209 includes an emitter that is coupled to the low power supply (GND), a base that is coupled to node 24, and a collector that is coupled to an output node (OUT2). Resistor R21 is coupled between the high power supply (VCC) and the output node (OUT2). The compensation circuit includes capacitor C21, which is coupled between node 24 and the output node (OUT2).

Transistors Q207–Q208 and current source I23 are arranged to operate as a differential pair that steers currents to nodes 21 and 22 based upon the difference between inputs INP2 and INM2. The input stage cooperates with the cascode stage to provide a first gain factor to the input signal. Node 24 is a high impedance node that corresponds to the output of the cascode stage. The signal at node 24 is related to the difference between the non-inverting and inverting inputs (INP1, INM1) and the first gain factor. Transistor Q209 and resistor R21 are arranged to operate as an inverting gain stage that receives the signal from node 24 and provides the output signal at the output terminal (OUT2). The output signal is related to the signal at node 24 by a second gain factor. The overall gain of operation amplifier 200 is determined by the first and second gain factors. The compensation circuit (e.g., C21) is arranged to provide stable operation of the operational amplifier by reducing the high frequency gain at node 24.

The operation of transistors Q201–Q208 is substantially similar to the operation of transistors M101–M108 described above. However, the polarity of the current steering is changed since the input stage in FIG. 2 is arranged as an N-type differential pair.

Transistors Q201/Q202 and Q203/Q204 are arranged to operate as a cascode current mirror. Transistors Q201 and Q202 have base terminals potentials that are coupled to node 23 such that the potential associated with node 23 must be at least one N-type BJT threshold voltage (Vth) above GND for proper operation. Transistors Q205 and Q206 have an associated collector-emitter voltage that must operate up to saturation (Vcesat1). Thus, Vth and Vcesat1 determine the minimum power-supply requirements for operational amplifier 200. For example, VCC corresponds to 0.8V when transistors Q201–Q202 have a threshold voltage of 0.6V and transistors Q205–Q206 have a saturation voltage of 200 mV.

Current sources I21 and I22 may correspond to transistors that are biased to operate as current sources. For example, a matched pair of P-type field effect transistors (or bipolar junction transistors) that are biased by a common bias signal may be employed as current sources I21 and I22. Alternatively, matched resistor circuits may replace current sources I21 and I22. Similarly, alternative circuits that provide the function of a current source may replace current source I23.

The minimum power supply requirements for the cascode stage also depend upon the type of current sources that are employed for current sources I21 and I22. For example, as described above current-sources I21 and I22 may correspond to a matched pair of P-type bipolar junction transistors that have a saturation voltage of Vcesat2. The minimum power supply requirements for the cascode stage, including P-type BJT current sources is determined by Vth (e.g., 0.6V), Vcesat1 (e.g., 200 mV) and Vcesat2 (e.g., 200 mV) such that VCC must be at least 1.0V for proper operation.

A biasing circuit (not shown) is required to provide the biasing signal (e.g., IBIAS). The cascode stage illustrated in FIG. 2 requires a minimum number of biasing lines for proper operation. By reducing the number of required biasing lines, biasing circuitry is reduced in complexity and the total power consumption of the biasing circuit is reduced by eliminating the additional circuitry that would otherwise be required.

Operation amplifier 200 is similar to operation amplifier 100 in that the arrangement includes an input stage, a cascode stage, and an output stage. However, the output stage of operational amplifier 200 includes a single inverting gain stage instead of two gain stages. Bipolar junction transistors have a higher overall gain characteristic when compared to field effect transistors that are under similar power supply requirements. An additional inverting gain stage may be added to the output stage illustrated in FIG. 2 when additional gain is necessary.

Figure 3:
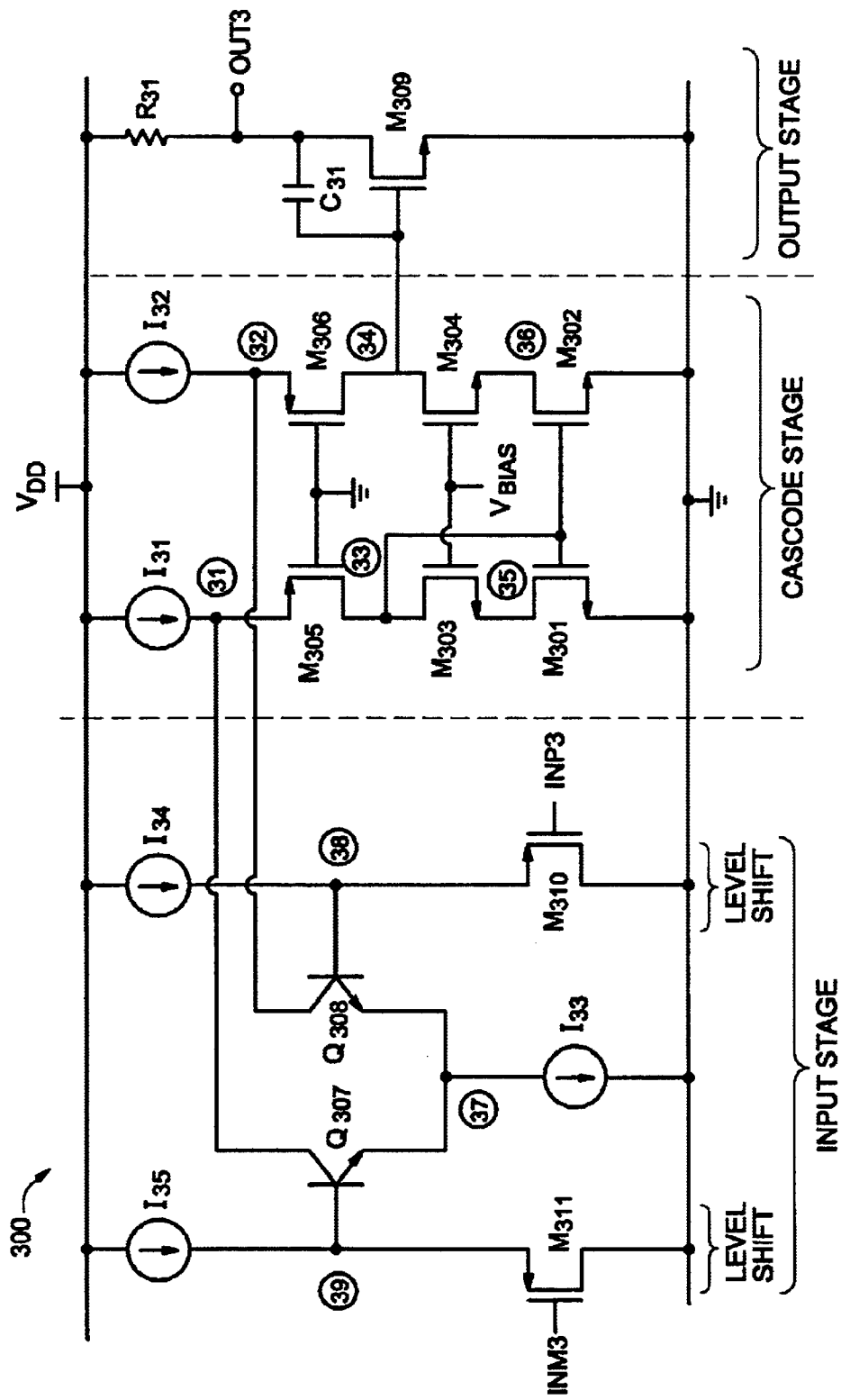
FIG. 3 is a schematic diagram of still another operational amplifier that includes another exemplary cascode stage that is in accordance with the present invention.

FIG. 3 is a schematic diagram of still another operational amplifier (300) that includes an exemplary cascode stage that is in accordance with the present invention. The operational amplifier (300) includes an input stage, a cascode stage, an output stage, and a compensation circuit.

The input stage includes transistors Q307–Q308, and current source I33. Transistors Q307–Q308 are illustrated as N-type bipolar junction transistors. Transistor Q307 includes an emitter that is coupled to node 37, a base that is coupled to node 39, and a collector that is coupled to node 31. Transistor Q308 includes an emitter that is coupled to node 37, a base that is coupled to node 38, and a collector that is coupled to node 32. Current source I33 is coupled between node 37 and a low power supply (GND).

The input stage may also include optional level shifter circuits as may be required in a particular system. For example, the output of level shifter circuits may be coupled to nodes 38 and 39 such that the amplifier is operational with input signals that are near the low power supply (GND). Transistors M310–M311 and current sources I34–I35 are arranged to operate as exemplary level shifter circuits. The level shift circuits are arranged to shift the DC level of the INP3 and INM3 signals such that they are suitable for use by the input differential pair.

Transistor M310 and current source I34 are arranged in a source follower configuration that increases the DC level of the voltage associated with INP3. Transistor M311 and current source I35 are arranged in a source follower configuration that increases the DC level of the voltage associated with INM3. Transistors M310 and M311 are illustrated as P-type field effect transistors. Transistors M310 includes a source that is coupled to node 38, a gate that is coupled to INP3, and a drain that is coupled to the low power supply (GND). Transistors M311 includes a source that is coupled to node 39, a gate that is coupled to INM3, and a drain that is coupled to the low power supply (GND). Current source I34 is coupled between the high power supply (VDD) and node 38, while current source I35 is coupled between the high power supply (VDD) and node 39.

The cascode stage includes transistors M301–M306, and current sources I31 and I32. Transistors M301–M304 are illustrated as N-type field effect transistors, while transistors M305–M306 are illustrated as P-type field effect transistors. Transistor M301 includes a source that is coupled to the low power supply (GND), a gate that is coupled to node 33, and a drain that is coupled to node 35. Transistor M302 includes a source that is coupled to the low power supply (GND), a gate that is coupled to node 33, and a drain that is coupled to node 36. Transistor M303 includes a source that is coupled to node 35, a gate that is coupled to a bias signal (i.e., bias voltage VBIAS), and a drain that is coupled to node 33. Transistor M304 includes a source that is coupled to node 36, a gate that is coupled to the bias signal (i.e., bias voltage VBIAS), and a drain that is coupled to node 34. Transistor M305 includes a source that is coupled to node 31, a gate that is coupled to the low power supply (GND), and a drain that is coupled to node 33. Transistor M306 includes a source that is coupled to node 32, a gate that is coupled to the bias signal (VBIAS), and a drain that is coupled to node 34. Current source I31 is coupled between the high power supply (VDD) and node 31, while current source I32 is coupled between the high power supply (VDD) and node 32.

The output stage includes transistor M309, and resistor R31. Transistor M309 is illustrated as an N-type field effect transistor. Transistor M309 includes a source that is coupled to the low power supply (GND), a gate that is coupled to node 34, and a collector that is coupled to an output node (OUT3). Resistor R31 is coupled between the high power supply (VDD) and the output node (OUT3). The compensation circuit includes capacitor C31, which is coupled between node 34 and the output node (OUT3).

Transistors Q307–Q308 and current source 123 are arranged to operate as a differential pair that steers currents to nodes 31 and 32 based upon the difference between inputs INP3 and INM3. The input stage cooperates with the cascode stage to provide a first gain factor to the input signal. Node 34 is a high impedance node that corresponds to the output of the cascode stage. The signal at node 34 is related to the difference between the non-inverting and inverting inputs (INP3, INM3) and the first gain factor. Transistor Q309 and resistor R31 are arranged to operate as an inverting gain stage that receives the signal from node 34 and provides the output signal at the output terminal (OUT3). The output signal is related to the signal at node 34 by a second gain factor. The overall gain of operation amplifier 300 is determined by the first and second gain factors. The compensation circuit (e.g., C31) is arranged to provide stable operation of the operational amplifier by reducing the high frequency gain at node 34.

The operation of transistors M301–M306 and Q307–Q308 is substantially similar to the operation of transistors M101–M108 described above. However, the polarity of the current steering is changed since the input stage in FIG. 3 is arranged as an N-type differential pair. Also, the bipolar transistors that are employed in the input stage provide high transconductance (gm) characteristics with low power consumption.

Transistors M301/M302 and M303/M304 are arranged to operate as a cascode current mirror. Transistors M301 and M302 have gate terminals that are coupled to node 33 such that the potential associated with node 33 must be at least one N-type FET threshold voltage (Vtn) above GND for proper operation. Transistors M305 and M306 have an associated drain-source voltage that must operate up to saturation (Vdssat1). Thus, Vtn and Vdssat1 determine the minimum power-supply requirements for operational amplifier 300. For example, VDD corresponds to 1.2V when transistors M301–M302 have a threshold voltage of 1V and transistors M305–M306 have a saturation voltage of 200 mV.

Current sources I31 and I32 may correspond to transistors that are biased to operate as current sources. For example, a matched pair of P-type field effect transistors or P-type BJT transistors that are biased by a common bias signal may be employed as current sources I31 and I32. Alternatively, matched resistor circuits may replace current sources I31 and I32. Similarly, alternative circuits that provide the function of a current source may replace current sources I33–I35.

The minimum power supply requirements for the cascode stage also depend upon the type of current sources that are employed for current sources I31 and I32. For example, as described above current-sources I31 and I32 may correspond to a matched pair of P-type FETs that have a saturation voltage of Vdssat2. The minimum power supply requirements for the cascode stage, including P-type FET current sources is determined by Vtn (e.g., 1V), Vdssat1 (e.g., 200 mV) and Vdssat2 (e.g., 200 mV) such that VDD must be at least 1.4V for proper operation.

A biasing circuit (not shown) is required to provide the biasing signal (e.g., VBIAS). The cascode stage illustrated in FIG. 3 requires a minimum number of biasing lines for proper operation. By reducing the number of required biasing lines, biasing circuitry is reduced in complexity and the total power consumption of the biasing circuit is reduced by eliminating the additional circuitry that would otherwise be required.

Operation amplifier 300 is similar to operation amplifier 100 in that the arrangement includes an input stage, a cascode stage, and an output stage. However, the output stage of operational amplifier 200 includes a single inverting gain stage instead of two gain stages. Bipolar junction transistors have a higher overall gain characteristic when compared to field effect transistors that are under similar power supply requirements. The BJT input stage provides high gain such that an additional inverting gain stage is not necessary. However, an addition gain stage may be added to the output stage illustrated in FIG. 3 when additional gain is necessary.

FIGS. 1–3 illustrate example applications of the cascode stage in operational amplifiers. The voltages at nodes 13/14, 23/24, and 33/34 are closely matched in the cascode stage such that overall offset in the amplifiers are reduced. For example, differences between the voltages at nodes 13 and 13 result in an input referred offset. By minimizing the cascode offset voltages, the overall performance of the operational amplifier is improved. The cascode stage arrangements provide a power supply rejections ratio (PSRR) that is improved when compared to conventional cascode stages. The cascode stages employ a simplified biasing arrangement such that low voltage operation is possible, while maintaining a minimum number of components in the required biasing circuits. Overall power consumption is reduced as a result of minimizing the biasing circuit requirements with the simplified biasing circuit.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus comprising
   a first current source that is coupled to a first node;
   a second current source that is coupled to a second node;
   a first transistor that is coupled between a first power supply and a fifth node, wherein the first transistor is biased by a third node;
   a second transistor that is coupled between the first power supply and a sixth node, wherein the second transistor is biased by the third node;
   a third transistor that is coupled between the third node and the fifth node, wherein the third transistor is biased by a second power supply;
   a fourth transistor that is coupled between a fourth node and the sixth node, wherein the fourth transistor is biased by the second power supply;
   a fifth transistor that is coupled between the first node and the third node, wherein the fifth transistor is biased by a bias signal;
   a sixth transistor that is coupled between the second node and the fourth node, wherein the sixth transistor is biased by the bias signal such that the fourth node operates as a high impedance node that is responsive to current signal that are provided to the first and second nodes, respectively; and
   an output stage that is arranged to receive a high gain signal from the high impedance node such that the output stage provides an output signal in response to the high gain signal wherein the output stage comprises; a ninth transistor and a resistor, wherein the ninth transistor and the resistor are configured to operate as a gain stage that is responsive to the high gain signal.

2. An apparatus as in claim 1, wherein the first current source and the second current source each comprise at least one of a resistor circuit, a field effect transistor that is arranged to provide current, and a bipolar junction transistor that is arranged to provide current.

3. An apparatus in claim 1, wherein the first, second, third and fourth transistors each comprise a P-type field effect transistor, the fifth and sixth transistors each comprise an N-type field effect transistor, the first power supply corresponds to a high power supply and the second power supply corresponds to a low power supply.

4. An apparatus as in claim 1, wherein the first, second, third, and fourth transistors each comprise an N-type bipolar junction transistor, the fifth and sixth transistors each comprise a P-type bipolar junction transistor, the first power supply corresponds to a high power supply and the second power supply corresponds to a low power supply.

5. An apparatus as in claim 5, further comprising an input stage that is arranged to receive a differential input signal and provide the current signals to the first and second nodes, respectively.

6. An apparatus as in claim 5, the input stage further comprising a differential pair that includes a seventh transistor and an eighth transistor that share a common node that is coupled to a third current source that provides a third current, wherein the seventh transistor is arranged to provide a second portion of the third current to the first node, and the eighth transistor is arranged to provide a second portion of the third current to the second node such that the first and second portions of the third current are determined by the differential input signal.

7. An apparatus as in claim 6, wherein the seventh and eighth transistors each comprise at least one of a field effect transistor, and a bipolar junction transistor.

8. An apparatus comprising a cascode stage and an input stage, the cascode stage comprising:
   a first current source that is coupled to a first node;
   a second current source that is coupled to a second node;
   a first transistor that is coupled between a first power supply and a fifth node, wherein the first transistor is biased by a third node;
   a second transistor that is coupled between the first power supply and a sixth node, wherein the second transistor is biased by the third node;
   a third transistor that is coupled between the third node and the fifth node wherein the third transistor is biased by a second power supply;
   a fourth transistor that is coupled between a fourth node and the sixth node, wherein the fourth transistor is biased by the second power supply;

a fifth transistor that is coupled between the first node and the third node, wherein the fifth transistor is biased by a bias signal; and a sixth transistor that is coupled between the second node and the fourth node, wherein the sixth transistor is biased by the bias signal, such that the fourth node operates as a high impedance node that is responsive to current signals that are provided to the first and second nodes, respectively;

the input stage comprising:

a differential pair that includes a seventh transistor and an eighth transistor that share a common node that is coupled to a third current source that provides a third current, wherein the seventh transistor is arranged to provide a first portion of the third current to the first node, and the eighth transistor is arranged to provide a second portion of the third current to the second node such that the first and second portions of the third current are determined by the differential input signal, the input stage being arranged to receive a differential input signal and provide the current signals to the first and second nodes, respectively; and level shifter circuits that are arranged to change the DC level associated with the differential input signal such that the seventh and eighth transistors are biased in active operation.

9. An operational amplifier, comprising:

a cascode stage comprising:
  a first current source than is coupled to a first node;
  a second current source that is coupled to a second node;
  a first transistor that is coupled between a first power supply and a fifth node, wherein the first transistor is biased by a third node,
  a second transistor that is coupled between the first power supply and a sixth node, wherein the second transistor is biased by the third node;
  a third transistor that is coupled between the third node and the fifth node, wherein the third transistor is biased by a second power supply;
  a fourth transistor that is coupled between a fourth node and the sixth node, wherein the fourth transistor is biased by the second power supply;
  a fifth transistor that is coupled between the first node and the third node, wherein the fifth transistor is biased by a bias signal; and
  a sixth transistor that is coupled between the second node and the fourth node,
  wherein the sixth transistor is biased by the bias signal, such that the fourth node operates as the high impedance node;

an input stage that is arranged to provide a first current to the first node and a second current to the second node in response to a differential input signal the input stage comprising:
  a third current source that is coupled to a common node;
  a seventh transistor that is coupled between the first node and the common node,
  wherein the seven transistor is responsive to a first portion of the differential input signal; and
  an eighth transistor that is coupled between the second node and the common node, wherein the eighth transistor is responsive to a second portion of the differential input signal;

an output stage that is arranged to provide an output signal in response to a high gain signal, wherein the input stage, the cascode stage, and the output stage are arranged to cooperate with one another such that the differential input signal is amplified to provide the output signal, the output stage comprising a ninth transistor and a resistor, wherein the ninth transistor and the resistor are configured to operate as a gain stage that is responsive to the high gain signal.

10. An operational amplifier as in claim 9, wherein the first current source, the second current source, and the third current source each comprise at least one of a resistor circuit, a field affect transistor that is arranged to provide current, and a bipolar junction transistor that is arranged to provide current.

11. An operational amplifier as in claim 9, wherein the first, second, third, fourth, seventh, and eighth transistors each comprise a P-type transistor, the fifth and sixth transistors each comprise an N-type transistor, the first power supply corresponds to a high power supply and the second power supply corresponds to a low power supply.

12. An operational amplifier as in claim 9, wherein the first, second, third, and fourth each comprise a P-type field effect transistor, the seventh and eighth transistors each comprise a P-type bipolar junction transistor, the fifth and sixth transistors each comprise an N-type field effect transistor, the first power supply corresponds to a high power supply and the second power supply corresponds to a low power supply.

13. An operational amplifier, comprising:

a cascode stage comprising:
  a first current source that is coupled to a first node;
  a second current source that is coupled to a second node;
  a first transistor that is coupled between a first power supply and a fifth node,
  wherein the first transistor is biased by a third node;
  a second transistor that is coupled between the first power supply and a sixth node, wherein the second transistor is biased by the third node;
  a third transistor that is coupled between the third node and the fifth node,
  wherein the third transistor is biased by a second power supply;
  a fourth transistor that is coupled between a fourth node and the sixth node,
  wherein the fourth transistor is biased by the second power supply;
  a fifth transistor that is coupled between the first node and the third node, wherein the fifth transistor is biased by a bias signal; and
  a sixth transistor that is coupled between the second node and the fourth node,
  wherein the sixth transistor is biased by the bias signal, such that the fourth node operates as the high impedance node;

an input stage that is arranged to provide a first current to the first node and a second current to the second node in response to a differential input signal the input stage further comprising:
  a third current source that is coupled to a common node;
  a seventh transistor that is coupled between the first node and the common node,
  wherein the seventh transistor is responsive to a first portion of the differential input signal;
  an eighth transistor that is coupled between the second node and the common node, wherein the eighth transistor is responsive to a second portion of the differential input signal; and level shifter circuits that are arranged to change the DC level associated with the differential input signal such that the seventh and eighth transistors are biased in active operation; and an output stage that is arranged to provide an output signal in response to a high gain signal, wherein the input stage, the cascode stage, and the output stage are arranged to cooperate with one another such that the differential input sign is amplified to provide the output signal.

14. An apparatus comprising a cascode stage, the cascode stage comprising:

a first current source that is coupled between a first node and a first power supply, a second current source that is coupled between a second node and a second power supply;

a first transistor that is coupled between a second power supply and a fifth node, wherein the first transistor is biased by a third node;

a second transistor that is coupled between the second power supply and a sixth node, wherein the second transistor is biased by the third node;

a third transistor that is coupled between the third node and the fifth node, wherein the third transistor is biased by a bias signal;

a fourth transistor that is coupled between a fourth node and the sixth node, wherein the fourth transistor is biased by the bias signal;

a fifth transistor that is coupled between the fist node and the third node, wherein the fifth transistor is biased by the second power supply;

a sixth transistor that is coupled between the second node and the fourth node, wherein the sixth transistor is biased by the second power supply such that the fourth node operates as a high impedance node that is responsive to current signals that are provided to the first and second nodes, respectively; and a ninth transistor and a resistor that are arranged to operate as a gain stage, wherein the gain stage is arranged to receive a high gain signal from the high impedance node such that the gain stage provides an output signal in response to the high gain signal.

15. An apparatus as in claim 14, wherein the first, second, third, and fourth transistors each comprise an N-type field effect transistor, the fifth and sixth transistors each comprise a P-type field effect transistor, the first power supply corresponds to a high power supply and the second power supply corresponds to a low power supply.

16. An apparatus as in claim 14, wherein the first, second, third and fourth transistors each comprise a P-type bipolar junction transistor, the fifth and six transistors each comprise a N-type bipolar junction transistor, the first power supply corresponds to a high power supply and the second power supply corresponds to a low power supply.

17. An apparatus as in claim 14, further comprising an input stage that is arranged to provide a first current to the first node and a second current to the second node in response to a differential input signal, the input stage comprising:

a third current source that is coupled to a common node;

a seventh transistor that is coupled between the first node and the common node, wherein the seventh transistor is responsive to a first portion of the differential input signal; and an eighth transistor that is coupled between the second node and the common node, wherein the eighth transistor is responsive to a second portion of the differential input signal.

18. An apparatus as in claim 17, wherein the seventh and eighth transistors each comprise an N-type bipolar junction transistor.

* * * * *

UNITED STATES PATENT AND TRADEMARK OFFICE
CERTIFICATE OF CORRECTION

PATENT NO.   : 6,788,143 B1
DATED        : September 7, 2004
INVENTOR(S)  : Sean S. Chen It is certified that error appears in the above-identified patent and that said Letters Patent is hereby corrected as shown below:

Column 1,
Line 21, "(VBLkS), a J source" should read -- (VBIAS), a source --

Column 4,
Line 47, "(Vgs M103/104)" should read -- (Vgs M103/M104) --

Column 5,
Line 63, "source 122" should read -- source I22 --

Column 6,
Line 7, "source 123" should read -- source I23 --
Line 29, "arc arranged" should read -- are arranged --

Column 7,
Line 24, "source 133" should read -- source I33 --

Column 8,
Line 18, "source 123" should read -- source I23 --.

Column 9,
Line 53, "An apparatus comprising" should read -- An apparatus comprising: --

Column 10,
Line 6, "bias signal such" should read -- bias signal, such --.
Line 8, "current signal" should read -- current signals --
Line 13, "gain signal wherein" should read -- gain signal, wherein --
Line 14, "comprises; a ninth transistor" should read -- comprises: a ninth transistor --
Line 35, "as in claim 5" should read -- as in claim 1 --
Line 44, "a second portion" should read -- a first portion --
Line 63, "fifth node wherein" should read -- fifth node, wherein --

UNITED STATES PATENT AND TRADEMARK OFFICE
CERTIFICATE OF CORRECTION

PATENT NO. : 6,788,143 B1
DATED : September 7, 2004
INVENTOR(S) : Sean S. Chen

It is certified that error appears in the above-identified patent and that said Letters Patent is hereby corrected as shown below:

Column 11,
Line 54, "input signal the" should read -- input signal, the --

Column 12,
Line 11, "field affect" should read -- field effect --
Line 58, "input signal the" should read -- input signal, the --

Column 13,
Line 11, "input sign" should read -- input signal --
Line 17, "power supply" should read -- power supply; --
Line 38, "supply such" should read -- supply, such --

Column 14,
Line 15, "third and fourth" should read -- third, and fourth --

Signed and Sealed this

Third Day of May, 2005

JON W. DUDAS
*Director of the United States Patent and Trademark Office*